United States Patent [19]

Wickersham

[11] Patent Number: 4,564,435
[45] Date of Patent: Jan. 14, 1986

[54] TARGET ASSEMBLY FOR SPUTTERING MAGNETIC MATERIAL

[75] Inventor: Charles E. Wickersham, Columbus, Ohio

[73] Assignee: Varian Associates, Inc., Palo Alto, Calif.

[21] Appl. No.: 738,205

[22] Filed: May 23, 1985

[51] Int. Cl.$^4$ ............................................. C23C 14/00
[52] U.S. Cl. .................................. 204/298; 204/192 R
[58] Field of Search .......................... 204/298, 192 R; 118/720, 721, 504, 505

[56] References Cited

U.S. PATENT DOCUMENTS

| | | | |
|---|---|---|---|
| 4,060,470 | 11/1977 | Clarke | 204/192 R |
| 4,100,055 | 7/1978 | Rainey | 204/298 |
| 4,299,678 | 11/1981 | Meckel | 204/192 M |
| 4,370,217 | 1/1983 | Funaki | 204/298 |
| 4,385,979 | 5/1983 | Pierce et al. | 204/298 |
| 4,414,086 | 11/1983 | Lamont, Jr. | 204/192 M |
| 4,416,759 | 11/1983 | Hara et al. | 204/298 |
| 4,436,602 | 3/1984 | Hara et al. | 204/192 R |
| 4,457,825 | 7/1984 | Lamont, Jr. | 204/298 |
| 4,500,409 | 2/1985 | Boys | 204/298 |

OTHER PUBLICATIONS

Jrl. of Crystal Growth 45 (1978), 361–364, "High Rate Deposition of Magnetic Films by Sputtering from Two Facing Targets"-, Naoe, Hoshi and Yamanaka.
One page from Varian Specialty Metals Division Sales Brochure (printed 9/78).

Primary Examiner—Andrew H. Metz
Assistant Examiner—Nam X. Nguyen
Attorney, Agent, or Firm—Stanley Z. Cole; David Schnapf

[57] ABSTRACT

An optimized annular sputter target assembly for use in sputtering magnetic material, comprising a thin target piece of magnetic material mounted on a backing structure of nonmagnetic material. Said backing structure provides means for easy mounting and removal of the target assembly and for providing good thermal and electrical contact with the cooling wall of the sputter source. The target piece has a portion extending radially outwardly from said cooling wall thereby providing greater target surface area.

8 Claims, 3 Drawing Figures

TARGET ASSEMBLY FOR SPUTTERING MAGNETIC MATERIAL

DESCRIPTION

1. Field of the Invention

This invention is in the field of vacuum sputter coating apparatus and particularly relates to sputter coating target assemblies made of magnetic material used in sputter coating apparatus.

2. Background of the Invention

Material deposition by sputter coating from a cathode target assembly has gained widespread use for a variety of materials and purposes. Sputter coating sources include cathode and anode structures operated in an evacuated chamber backfilled with a sputter gas (typically argon) at low pressure. A glow discharge is created when a high voltage is placed between the anode and the cathode. Positive ions formed in the glow discharge region are attracted to and impact the cathode surface which serves as the sputter target. Such ion impacts cause the release of the target material into the vacuum chamber and on to the work piece or substrate.

It is well known that the application of a magnetic field, which acts in combination with the electric field created by the voltage difference between the anode and cathode, can greatly enhance the performance of the sputtering apparatus. Sources employing intersecting magnetic and electric fields are generally referred to as magnetron sputter sources.

In magnetron sputter sources of modern design the magnetic poles are usually positioned such that fringing magnetic field lines from one pole pass through the target and then to the other pole to complete the magnetic circuit. Such fringing magnetic field lines serve to "trap" electrons above the target so as to significantly increase the number of collisions between electrons and gas atoms in the space, known as the glow discharge region, above the target. These collisions form the ions which cause sputtering from the target.

The nature and position of the glow discharge region is determined by a complex relationship between the geometries and intensities of the magnetic field and the electric field, which, in turn, are affected by the geometries of the cathode structure, the anode structure and the magnetic circuit. The relationships between these elements can change over time as the target cathode is eroded and changes shape.

Considerable inventive effort has been directed towards optimizing the geometrical relationships between these structural elements as they relate to specific sputtering applications. It is desirable to provide configurations which allow for efficient and uniform sputtering. Other significant design considerations pertaining to the target structure relate to the ease of target replacement and efficient target cooling.

An example of an especially advantageous sputter source for use in coating semiconductor wafers is disclosed in U.S. Pat. No. 4,457,825 issued to Lamont and co-assigned with the present invention. Examples of other types of target geometries are described in U.S. Pat. No. 4,100,055 entitled "Target Profile For Sputtering Apparatus", issued to Rainey and also co-assigned with the present invention.

Magnetron sputter sources normally employ relatively massive targets which can deposit relatively large amounts of target material before requiring replacement. Such massive targets are excellent for sputtering nonmagnetic material, but are not practical when it is necessary to make the targets of magnetic material in order to sputter magnetic coatings on substrates.

Targets for sputtering magnetic materials pose special problems due to the fact that the material itself affects the magnetic field configuration. Alteration of the magnetic field configuration, in turn, changes the nature and location of the glow discharge region. These changes adversely affect the performance of the sputter source. In particular, the problem with magnetic targets is that the magnetic field lines tend to be shunted through the magnetic material of the target, with the consequence that the fringing magnetic field above the target surface is substantially eliminated or weakened. As a result, the ability of the magnetic field to trap electrons is dimimished.

Numerous attempts have been made to solve the problem of providing satisfactory magnetron sputter sources employing magnetic targets. One approach is to operate the target near its Curie temperature so that the target material loses its magnetic character. Another approach is to create such a strong magnetic field that the magnetic target material becomes saturated and thus allows magnetic field lines to fringe over the sputter surface of the target instead of being entirely shunted through the target.

Yet another approach is to design the sputter source so that the positioning of the magnetic poles and targets is such that the magnetic field lines pass from one pole through to a first target piece and then through space until they reach the other target place and to the other magnetic pole.

A still further approach is to make the target thin so that the relatively weak magnetic field used in a conventional magnetron sputter source is sufficient to saturate the target. This approach has previously been limited to thin wall targets having a substantially right cylindrical shape so as to abut a surrounding right cylindrical cooling wall.

As described above, U.S. Pat. No. 4,457,825 to Lamont discloses an improved sputter source. This source is sold commercially by Varian under the trademark "ConMag ®." The geometry of the magnetic field used in the ConMag source is markedly different from the prior art. Accordingly, the target geometry is also significantly different from the prior art. The ConMag ® employs magnetic mirroring to confine electrons in the glow discharge region rather than relying primarily on electrostatic forces. Reliance on magnetic mirroring in the ConMag ® involves special complications regarding sensitivity to magnetic field distorting target materials.

Accordingly, it is an invention to provide a magnetic sputter target compatible for use in sputtering systems with unique target and magnetic field geometries.

Another object of this invention is to provide a target assembly comprising a combination of magnetic and nonmagnetic material for use in glow discharge magnetron sputtering.

Yet another object of this invention is to provide a magnetic sputter target with improved capability for target cooling and ease of replacement without increasing the mass of magnetic material and without causing a serious adverse affect on the magnetic field configuration.

Still another object of this invention is to provide a magnetic sputter target which is designed for optimal use with the ConMag® sputter source.

A further object of this invention is to provide an annular magnetic target which can be used interchangeably with a relatively massive annular nonmagnetic target in an existing sputter source without changing the configuration of the cooling wall of the source.

SUMMARY OF THE INVENTION

The present invention is directed to sputter sources having an annular cooling wall against which an annular target expands to make good thermal and electrical contact between the target and the cooling wall, and in which the desired cross sectional shape of the target does not fit the shape of the cooling wall.

The present invention comprises a novel target assembly for sputtering magnetic material for use in advanced magnetron glow discharge sputter coating apparatus. The assembly is generally annular and consists of two portions. The first portion is of magnetic material formed into a relatively thin target. This portion is easily saturated by the magnetic field of the source and, accordingly, is designed to minimize disturbance of the magnetic field. The second portion is a backing structure of nonmagnetic material. Since this second portion does not affect the magnetic field, it can add to the mass of the first portion without disturbing the desired magnetic field, thereby allowing the target assembly to be easily mounted and to make good thermal contact with the source to obtain efficient target cooling.

DETAILED DESCRIPTION OF THE INVENTION

Figure 1:
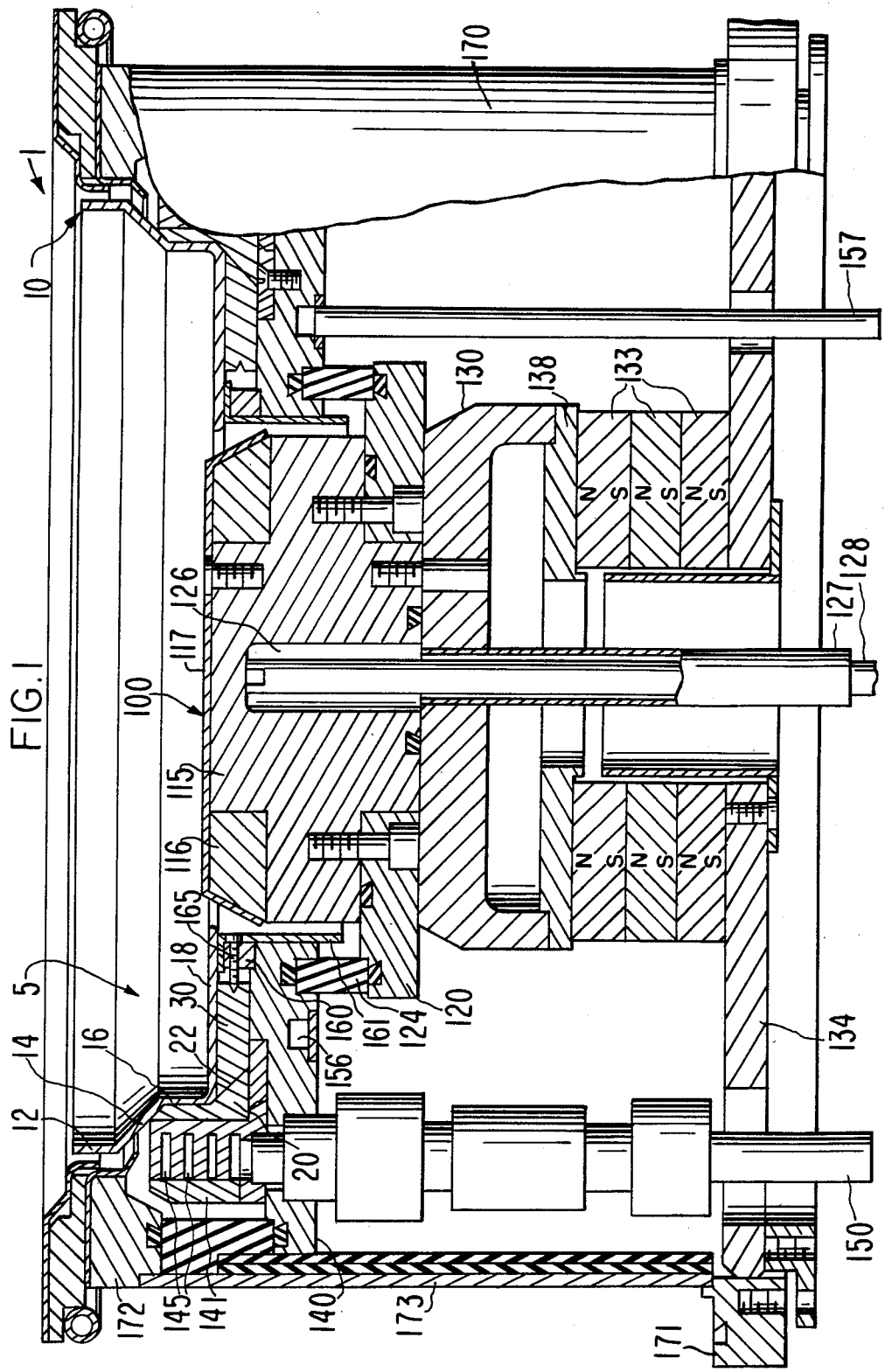
FIG. 1 is a cross-sectional view of advanced sputter coating apparatus with the target assembly of the present invention mounted therein.

A preferred embodiment of the present invention is described in the context of the sputter coating source of FIG. 1. FIG. 1 is a section of an advanced sputter coating source, as disclosed in U.S. Pat. No. 4,457,825 (described above in the "Background of the Invention" section) with the target assembly of the present invention mounted therein. This source is sold by Varian Associates, Inc. under the trademark "ConMag®." The target assembly 5 consists of three pieces 10, 20 and 30.

Central circular anode 100, is surrounded by the present target assembly 5 consisting of the three pieces 10, 20 and 30. These pieces are in electrical and thermal contact with each other and are held at negative potential relative to the anode 100 and thereby serve as a cathode for the apparatus. The three pieces of the cathode/target assembly are each annular. The first annular target piece 10 consists of magnetic material, such as nickel, and serves as the target for bombardment by ions from the glow discharge. The second target assembly piece 20 is of a generally cylindrical shape with an inwardly and downwardly sloped inner rim 22. The third target assembly piece 30 is generally ring-shaped with the outer edge of the ring shaped and dimensioned to fit the inner rim 22 of the generally cylindrical second target assembly piece 20. Both pieces 20 and 30 are made of nonmagnetic material, such as aluminum, and are shielded from ion bombardment by the first target piece 10. The details of the cross-sectional shape of the target assembly will be described hereinafter in respect to FIGS. 2 and 3.

Anode 100 serves both as an electrical field forming electrode and as one end of the magnetic field forming circuit. More specifically, anode 100 comprises a magnetic pole piece 115, and in order to facilitate insertion and removal of the cathode/target assembly (as will be hereinafter described in detail), pole piece 115 preferably includes a removable annular ring portion 116. Also, a removable thin anode surface sheet in the form of an inverted cup 117 is held in place by screws. Anode surface sheet 117 can be magnetic or nonmagnetic material, but if nonmagnetic, it should be sufficiently thin to preserve the desired magnetic field strength at the anode surface.

An annular member 120, made of nonmagnetic material, is attached to pole piece 115. An electrical insulator ring 124 insulates anode 100 from the cathode/target assembly. Anode 100 including pole piece 115 is cooled by passing coolant through a channel 126 via coaxial conduits 127 and 128. An inverted cup-shaped magnetic member 130 is secured to pole piece 115. Annular magnets 133 provides a magnetic field for the magnetically enhanced sputter source. Alternatively, an annular electromagnet (not shown) may be used in combination with permanent magnets 133 to provide an electrically controllable portion of the magnetic field.

Magnets 133 are placed on a magnetic base plate 134 onto which they are held by magnetic attraction. A magnetic ring 138 is placed between magnetic member 130 and upper magnet 133. Magnetic members 130 and 138 and magnets 133 are held together by magnet attraction.

The cathode/target assembly is secured to a nonmagnetic annular base member 140 and is also surrounded by nonmagnetic water jacket 141. Target assembly piece 20 and water jacket 141 are so dimensioned that room temperature clearance between these members is large enough to allow easy installation and removal, yet small enough to provide adequate thermal contact for cooling when the target assembly expands upon heating during normal operation. Water jacket 141 is secured mechanically to base member 140. Water jacket 141 has internal channels 145 through which coolant, preferably water, is circulated via conduits 150 (one shown). Direct cooling of base member 140 is provided by water channel 156 through which coolant is circulated via conduits 157 (one shown).

Base member 140 has secured to it a cathode retainer ring 160. A shield ring 161 has an outwardly projecting upper lip portion which is sandwiched between the top of retainer ring 160 and target assembly piece 10. The purpose of shield ring 161 is to reduce undesired coating of anode insulator 124 during sputter source operation. Retainer ring 160 contains a plurality of threaded holes, and shield 161 contains a plurality of corresponding clearance holes which are brought into registry during assembly. Target assembly piece 30 contains an inner rim portion including an annular V-groove 32. The threaded holes in retaining ring 160 engage threaded members 165, which may be dog point set screws, for example, or, alternatively, special screws incorporating spring loaded ball plungers. Tightening threaded members 165 against the V-groove provides positive retention of the target assembly upon normal installation at room temperature. The number of threaded members 165 is preferably three. The V-groove in cooperation with threaded members 165 serve to prevent the target assembly from falling a significant distance away from base member 140 in case the sputter source is oriented in an inverted position, for example. Moreover, thermal expansion of the target assembly during normal operation tends to hold it securely in water jacket 141.

Replacement of the target assembly 5 is accomplished by removing anode surface sheet 117 and annular ring portion 116 from pole piece 115 and then unscrewing threaded members 165 enough to release the target assembly, which in turn releases shield ring 161 which is simply held in place by the presence of target assembly piece 10.

A housing 170 for the anode cathode assembly comprises a lower ring member 171 and an outer magnetic pole piece 172 joined together by a cylindrical member 173. Members 171 and 173 are made of magnetic material, such as cold rolled steel, to provide portions of the required magnetic path to pole piece 172.

As described in greater detail in the Lamont patent identified above, the sputter source shown in FIG. 1 employs a modified magnetic tunnel in which one side of the tunnel is formed by a magnetic mirror. Design of the magnetic circuit overall, including particularly the geometries of the center pole piece 115 and outer pole piece 172 has led to use of a magnetic field configuration in which the field lines are relatively straight parallel to each other in the vicinity of the anode structure. The novel magnetic mirroring properties of the FIG. 1 sputter source are described in the Lamont patent, identified above, and which is hereby incorporated by reference. Particular attention is directed to column 14, line 38 through column 17, line 40.

Figure 2:
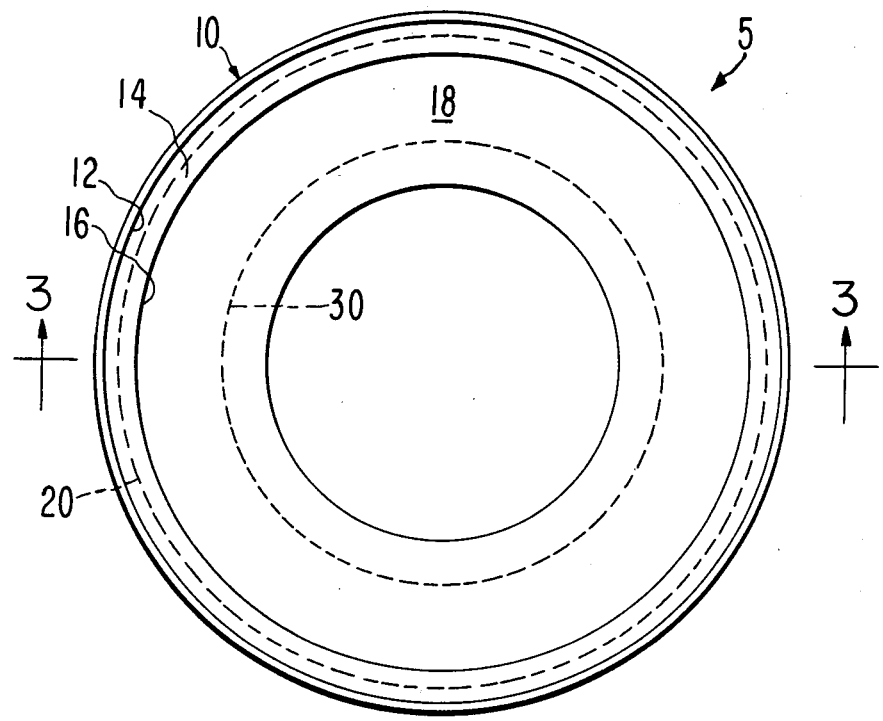
FIG. 2 is a top view of a target assembly incorporating the present invention.
Figure 3:
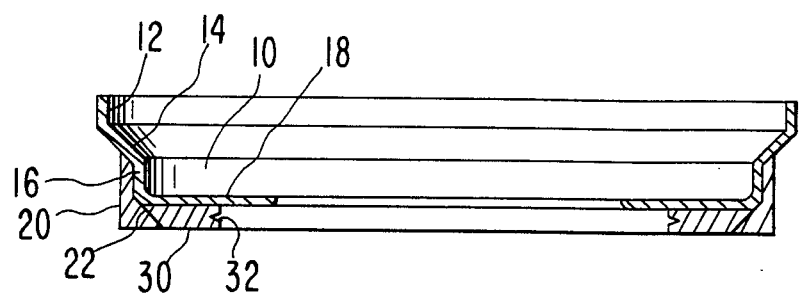
FIG. 3 is a section of the target assembly of FIG. 2 taken along the line 3—3 thereof.

As shown in greater detail in FIGS. 2 and 3, the target assembly 5 of the preferred embodiment of the present invention consists of three pieces, 10, 20 and 30. Target piece 10 is situated adjacent to the glow discharge region and is therefore subject to ion bombardment. It is annular in shape and is made of the desired magnetic material for sputtering. First target piece 10 comprises four sections as follows. A first cylindrical portion 12 is situated radially outwardly of the entire assembly. A second portion 14 is situated radially inward from said first portion and has a truncated conical shape which interconnects at its upper end with said first portion 12. Second portion 14 intersects at its lower end with a third portion 16 of cylindrical shape. Said third cylindrical portion 16 is situated radially inward from said second portion 14. A fourth portion 18 is situated radially inward from said third cylindrical portion 16 and is connected to the lower end of said third cylindrical portion 16. The four portions of said target assembly piece 10 are of relatively thin unitary construction. Piece 10 can be shaped into the proper configuration by hydroforming or other conventional means.

In the preferred embodiment of the present invention, the magnetic target piece 10 is mounted on a nonmagnetic backing structure consisting of two pieces, 20 and 30. The two-piece design for the nonmagnetic backing structure is for ease of mounting and construction. It should be understood that the nonmagnetic backing structure can also be of unitary construction and still be within the intent of the present invention. The two backing pieces may be pre-bonded by press fitting. When target piece 10 is in position shown in FIG. 2, sloping rim 22 helps to serve to prevent backing piece 30 from separating from backing piece 20. Obviously, the interface between backing pieces 20 and 30 can be of a different shape while accomplishing this same purpose.

The magnetic target piece 10 is joined to the nonmagnetic backing pieces 20 and 30 by shrink fitting or other conventional means. Shrink fitting is accomplished by preheating the backing structure so that it expands to at least a diameter which is slightly greater than the diameter of the target piece 10 at room temperature. The room temperature target piece is then inserted in the backing structure. Upon cooling the backing structure contracts and securely grips the target piece.

For magnetic material, such as Cobalt, which is not susceptible to hydroforming, the target piece can be formed by plasma spraying the material. Target thicknesses up to 90 mils are readily obtainable in this manner. An aluminum piece, which may be shaped by hydroforming, can serve as the mold for the plasma spraying operation. The resulting Cobalt target piece can then be separated from the mold and inserted in the backing structure described above. Alternatively, the mold itself can be designed to serve as the backing structure. In such a case, the backing structure will be of unitary construction with a shape conforming to the shape of the target piece 10 rather than the shape described above for the preferred embodiment.

While only certain embodiments of the invention have been illustrated and described, it is understood that alterations, modifications and changes can be made without departing from the true scope and spirit of the invention as defined by the following claims.

What is claimed is:

1. An annular sputter coating target assembly for use in sputter coating apparatus, said annular target assembly comprising:
   a sputter target piece having:
   a first portion of substantially right cylindrical shape,
   a second portion of substantially right cylindrical shape of smaller diameter than said first portion,
   a third portion interconnecting said first and second portions and having a truncated conical shape, and
   a fourth portion extending radially inward from said second portion and having a substantially planar shape, all of said four portions being made of magnetic material; and
   a backing structure on the side of said sputter target piece opposite the surface from which sputtering is to occur, said backing structure being made of nonmagnetic material.

2. The sputter coating target of claim 1 in which said magnetic material is nickel.

3. The sputter coating target of claim 1 in which said nonmagnetic material is aluminum.

4. The sputter coating target of claim 1 in which said magnetic material is cobalt.

5. The sputter coating target of claim 1 in which said backing structure comprises a first backing piece portion being of substantially right cylindrical shape, and a second backing piece portion being of substantially planar shape and abutting said first backing piece portion radially inward from said first backing piece portion; the inner diameter of said first backing piece portion being substantially the same as the outer diameter of said second portion of said sputter target piece.

6. The target assembly of claim 5 wherein said second backing piece portion is substantially thicker than said target piece.

7. The target assembly of claim 5 wherein said first and second backing piece portions abut each other along an intersection having the shape of a truncated cone sloped such that said first backing piece portion holds said second backing piece portion against said fourth portion of said target piece.

8. The sputter coating target assembly of claim 1 in which said backing structure has the same shape as the sputter target piece.

* * * * *